United States Patent
Koch

(10) Patent No.: US 12,203,988 B2
(45) Date of Patent: Jan. 21, 2025

(54) SYSTEM AND METHOD FOR IDENTIFYING NON-SWITCHING SEMICONDUCTOR SWITCHES

(71) Applicant: LEONI BORDNETZ-SYSTEME GMBH, Kitzingen (DE)

(72) Inventor: Wolfgang Koch, Buchbrunn (DE)

(73) Assignee: LEONI BORDNETZ-SYSTEME GMBH, Kitzingen (DE)

( * ) Notice: Subject to any disclaimer, the term of this patent is extended or adjusted under 35 U.S.C. 154(b) by 157 days.

(21) Appl. No.: 17/799,712

(22) PCT Filed: Dec. 18, 2020

(86) PCT No.: PCT/EP2020/087019
§ 371 (c)(1),
(2) Date: Aug. 15, 2022

(87) PCT Pub. No.: WO2021/164927
PCT Pub. Date: Aug. 26, 2021

(65) Prior Publication Data
US 2023/0060718 A1 Mar. 2, 2023

(30) Foreign Application Priority Data
Feb. 17, 2020 (DE) ..................... 10 2020 104 110.1

(51) Int. Cl.
*G01R 31/327* (2006.01)
*G01R 31/26* (2020.01)

(52) U.S. Cl.
CPC ....... *G01R 31/327* (2013.01); *G01R 31/2621* (2013.01); *G01R 31/2633* (2013.01)

(58) Field of Classification Search
CPC .............. G01R 31/327; G01R 31/2621; G01R 31/2633; G01R 31/333; H03K 17/18
See application file for complete search history.

(56) References Cited

U.S. PATENT DOCUMENTS

| 4,656,634 A * | 4/1987 | Lombardi ............. F02P 15/008 |
| | | 370/216 |
| 10,782,347 B2 * | 9/2020 | Meyer .............. G01R 31/31716 |

(Continued)

FOREIGN PATENT DOCUMENTS

| DE | 102012219243 A1 | 4/2014 |
| EP | 2645511 A1 | 10/2013 |

(Continued)

OTHER PUBLICATIONS

International Search Report and Written Opinion issued in connection with corresponding PCT Patent Application No. PCT/EP2020/087019 dated Mar. 25, 2021.

(Continued)

*Primary Examiner* — Akm Zakaria
(74) *Attorney, Agent, or Firm* — Tarolli, Sundheim, Covell & Tummino LLP

(57) ABSTRACT

The invention relates to a system (30) and a method for identifying a non-switching semiconductor switch (34a, 36a). The system (30) comprises a first semiconductor switch (34a), a first semiconductor component (34b), a second semiconductor switch (36a), a second semiconductor component (36b), a first resistor (64b), a second resistor (66b) and a detection unit (38). The detection unit (38) is designed to identify, on the basis of a curve of a first voltage dropping across the first resistor (64b), whether the first semiconductor switch (34a) is not switching. The detection unit (38) is designed to identify, on the basis of a curve of a second voltage dropping across the second resistor (66b), whether the second semiconductor switch (36a) is not switching.

8 Claims, 6 Drawing Sheets

(56) References Cited

Figure 1:
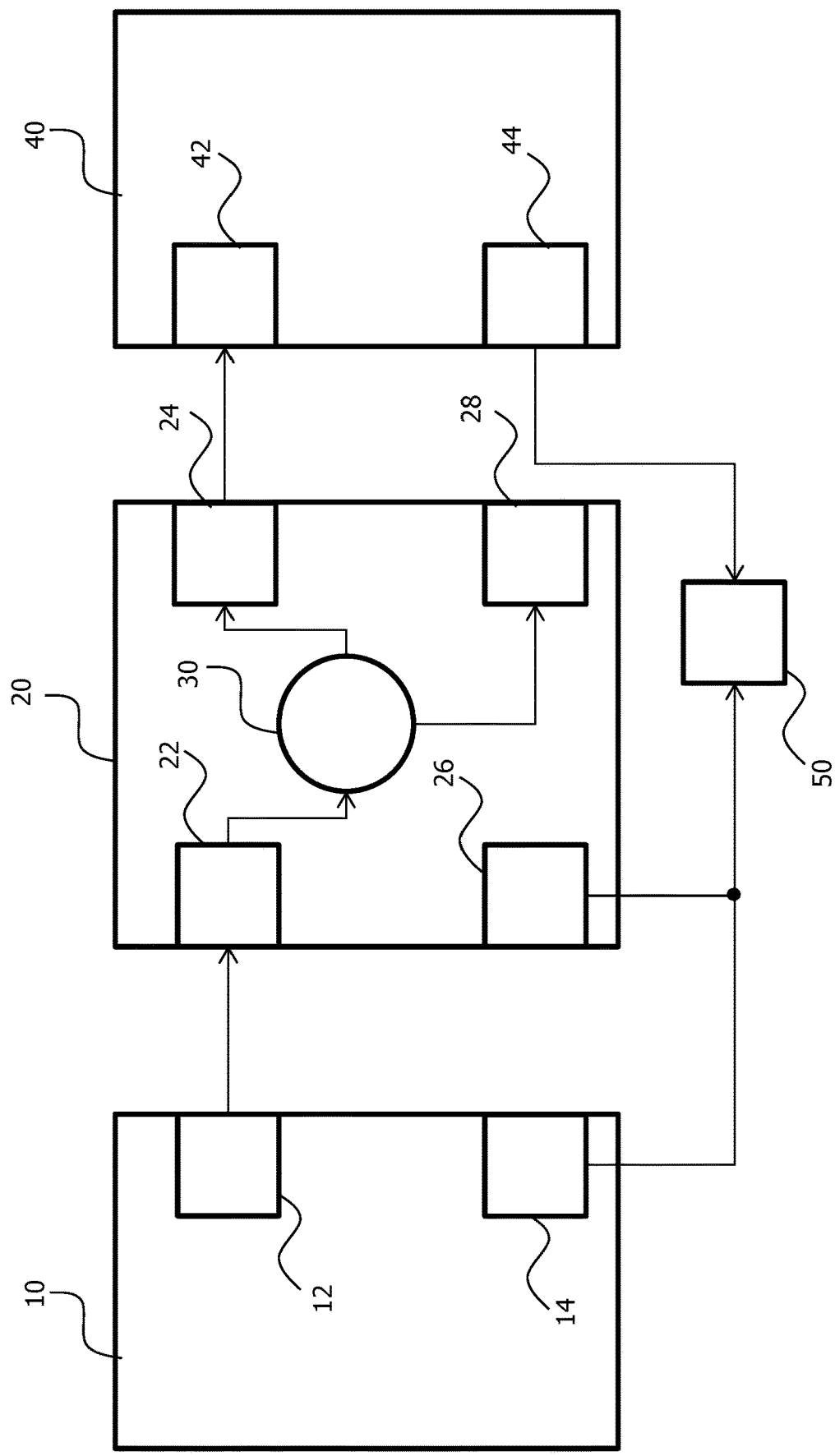

U.S. PATENT DOCUMENTS 11,821,934 B2 * 11/2023 Hanaoka ............ G01R 31/3277
2018/0123584 A1 * 5/2018 Morimoto ............. B60L 3/0084

FOREIGN PATENT DOCUMENTS

| EP | 3460593 A1 | 3/2019 |
| JP | 2007336665 A | 12/2007 |
| JP | 2017183764 A | 10/2017 |

OTHER PUBLICATIONS

JP Office Action for corresponding JP Application No. 2022-549385, dated Aug. 6, 2024, 11 pgs.

* cited by examiner

# SYSTEM AND METHOD FOR IDENTIFYING NON-SWITCHING SEMICONDUCTOR SWITCHES

RELATED APPLICATIONS

The present invention is a U.S. National Stage under 35 USC 371 patent application, claiming priority to Serial No. PCT/EP2020/087019, filed on Dec. 18, 2020, which claims priority from German Patent Application No. 10 2020 104 110.1 filed on Feb. 17, 2020; the entireties of both are hereby incorporated herein by reference.

The present invention relates generally to the identification of non-switching semiconductor switches. Specifically, the present invention relates to a system and a method for identifying a non-switching semiconductor switch.

In electronic power distributors, in particular in those with high demands in terms of functional safety, it is of particular importance that the state of health (SoH) of the power semiconductors used is known at all times if possible. To this end, it is important to know whether a power semiconductor serving as a switch is capable of reliably switching, in particular switching off, in all circumstances during operation. If this is not possible, the only possibility is to connect a second power semiconductor in series with the power semiconductor. However, this increases the costs, the space requirement and the power loss of the current path. Furthermore, the series connection of a second power semiconductor only statistically reduces the probability of a failure of the current path. An actual check and/or diagnosis of a successful switching operation of the semiconductor is possible only by switching off the semiconductor.

DE 43 01 605 C1 discloses a method and an assembly for monitoring the switching on and off of a controllable power semiconductor device in a power electronic circuit. In the case of a control signal for switching on the power semiconductor device, count signals are formed from level changes of the signal supplied to the gate electrode and the level changes at an output electrode during switching of the power semiconductor device. The count signals are added up in a first counter and compared with a predefined count value associated with fault-free operation of the power semiconductor device. A fault is signaled when there is a difference between the sum of the count signals and the predefined count value.

This method and the associated assembly are disadvantageous at least inasmuch as they function only in the case of continually switching switches. In static operation, the system cannot diagnose a fault directly. The method and the assembly of DE 43 01 605 C1 are therefore not sufficiently reliable for identifying faults in particular in static operation.

There is therefore a need for reliable and accurate identification of non-switching semiconductor switches. Identification is to be possible in particular without having to switch off an associated load.

According to a first aspect of the invention, a system for identifying a non-switching semiconductor switch is provided. The system has a first semiconductor switch, a first semiconductor device, a second semiconductor switch, a second semiconductor device, a first resistor, a second resistor, and a determination unit. The first semiconductor switch is controllable by means of a first control signal. The first semiconductor device is configured and arranged to prevent a current flow through the first semiconductor device at least in one direction. The second semiconductor switch is controllable by means of a second control signal. The second semiconductor device is configured and arranged to prevent a current flow through the second semiconductor device at least in one direction.

One end of the first resistor is connected between the first semiconductor switch and the first semiconductor device. Another end of the first resistor is connected to a reference potential, for example to ground. One end of the second resistor is connected between the second semiconductor switch and the second semiconductor device. Another end of the second resistor is connected to the reference potential, for example to ground. The determination unit is configured to identify, on the basis of a profile of a first voltage across the first resistor, whether the first semiconductor switch does not switch. The determination unit is configured to identify, on the basis of a profile of a second voltage across the second resistor, whether the second semiconductor switch does not switch.

In this manner, it can be determined simply and accurately whether at least one of the two semiconductor switches does not switch. The profile is in particular a profile over time.

For example, the determination unit can be configured to identify, directly on the basis of the profile (over time) or solely from the profile (over time) of the first voltage, whether the first semiconductor switch switches correctly. The determination unit can further be configured to determine, on the basis of the profile (over time) of the first voltage, an output signal that allows/enables a fault in the switching of the first semiconductor switch to be identified. For example, the determination unit can be configured to identify, directly on the basis of the profile (over time) or solely from the profile (over time) of the second voltage, whether the second semiconductor switch switches correctly. The determination unit can further be configured to determine, on the basis of the profile (over time) of the second voltage, an output signal that allows/enables a fault in the switching of the second semiconductor switch to be identified.

The first semiconductor switch can assume an opened/open switching state and a closed switching state. The first semiconductor switch can be transferred by means of the first control signal from the open switching state into the closed switching state and vice versa. For this purpose, the first control signal can be applied to a terminal, for example (in the case of a field-effect transistor) a gate terminal, of the first semiconductor switch.

The determination unit can be configured to identify a fault in the switching of the first semiconductor switch from a closed switching state into an open switching state. Additionally or alternatively, the determination unit can be configured to identify a fault in the switching of the second semiconductor switch from a closed switching state into an open switching state. The determination unit can be configured to identify, on the basis of the profile of the first voltage, whether the first semiconductor switch switches correctly from the closed switching state into the open switching state. The determination unit can be configured to identify, on the basis of the profile of the first voltage, whether the first semiconductor switch switches correctly from the open switching state into the closed switching state. In other words, the determination unit is able to identify whether the first and/or the second semiconductor switch can or cannot (correctly) be transferred from a closed switching state into an open switching state.

The second semiconductor switch can assume an opened/open switching state and a closed switching state.

The second semiconductor switch can be transferred by means of the second control signal from the open switching state into the closed switching state and vice versa. For this purpose, the second control signal can be applied to a terminal, for example (in the case of a field-effect transistor) a gate terminal, of the second semiconductor switch.

The determination unit can be configured to identify a fault in the switching of the first semiconductor switch from an open switching state into a closed switching state. Additionally or alternatively, the determination unit can be configured to identify a fault in the switching of the second semiconductor switch from an open switching state into a closed switching state. The determination unit can be configured to identify, on the basis of the profile of the second voltage, whether the second switch switches correctly from the closed switching state into the open switching state. The determination unit can be configured to identify, on the basis of the profile of the second voltage, whether the second switch switches correctly from the open switching state into the closed switching state. In other words, the determination unit is able to identify whether the first and/or the second semiconductor switch can or cannot (correctly) be transferred from an open switching state into a closed switching state.

Accordingly, the system for identifying a non-switching semiconductor switch can alternatively also be referred to as a system for identifying a fault in the switching of a semiconductor switch. The fault can be identified manually, for example, by consideration of the profile of the first and/or second voltage or a signal derived from the profile of the first and/or second voltage. Alternatively, the fault can be identified in an automated manner by an identification component on the basis of the profile of the first and/or second voltage or a signal derived from the profile of the first and/or second voltage. The system can further have the identification component. The identification component can be configured to identify the fault in the switching of the first semiconductor switch on the basis of the output signal. Additionally or alternatively, the identification component can be configured to identify the fault in the switching of the second semiconductor switch on the basis of the output signal.

For acquiring the first voltage drop across the first resistor, a first voltage acquisition component, for example a voltmeter, can be provided. The first voltage acquisition component can be configured to acquire the profile of the first voltage drop across the first resistor. The first resistor can be part of a first voltage divider/first voltage divider circuit. For acquiring the second voltage drop across the second resistor, a second voltage acquisition component, for example a voltmeter, can be provided. The second voltage acquisition component can be configured to acquire the profile of the second voltage drop across the second resistor. The second resistor can be part of a second voltage divider/second voltage divider circuit.

The first semiconductor device can be in the form of a semiconductor diode. The semiconductor diode will be referred to in the following text as the first semiconductor diode. The first semiconductor diode can form a first semiconductor device pair with the first semiconductor switch. The first semiconductor diode can be arranged to form a first path with the first resistor when the first semiconductor switch is in an open state. The first semiconductor diode can be configured to prevent a current flow through the first path that has been formed when the first semiconductor switch is in an open state. Because one end of the first resistor—regardless of whether the first resistor is or is not part of a first voltage divider—is connected between the first semiconductor switch and the first semiconductor diode, the resistor and the first semiconductor diode form a series circuit as the first path when the first semiconductor switch is in an open switching state. In this case, a current could flow into the first resistor via the first semiconductor device and falsify the result of the determination unit of whether the first semiconductor switch switches correctly. In order to reduce or even prevent such falsification, the first semiconductor diode can be arranged to prevent a current flow through the first semiconductor diode in the direction of the first resistor connected in series when the first semiconductor switch is open. In this manner, the accuracy of the determination can be increased.

The second semiconductor device can be in the form of a semiconductor diode. The semiconductor diode will be referred to in the following text as the second semiconductor diode. The second semiconductor diode can form a second semiconductor device pair with the second semiconductor switch. The second semiconductor diode can be arranged to form a second path with the second resistor when the second semiconductor switch is in an open state. The second semiconductor diode can be configured to prevent a current flow through the second path that has been formed when the second semiconductor switch is in the open state. Because one end of the second resistor is connected between the second semiconductor switch and the second semiconductor diode, the resistor and the second semiconductor diode form a series circuit as the second path when the second semiconductor switch is in an open switching state. In this case, a current could flow into the second resistor via the second semiconductor device and falsify the result of the determination unit of whether the second semiconductor switch switches correctly. In order to reduce or even prevent such falsification, the second semiconductor diode can be arranged to prevent a current flow through the second semiconductor diode in the direction of the second resistor connected in series when the second semiconductor switch is open. In this manner, the accuracy of the determination can be increased.

The first semiconductor device can be in the form of a semiconductor switch. The first semiconductor device in the form of a semiconductor switch can be connected anti-serially to the first semiconductor switch. Anti-serially can here be understood as meaning that the two components (i.e. the semiconductor switches) are connected in series with opposite polarity. The two semiconductor switches connected in this way can form a first semiconductor switch pair and can be referred to as such. The semiconductor switches of the first semiconductor switch pair can be controlled by the first control signal. For example, in each case the same terminal, for example the gate terminal, of the semiconductor switches of the first semiconductor switch pair can be controlled by the first control signal.

The second semiconductor device can be in the form of a semiconductor switch. The second semiconductor device in the form of a semiconductor switch can be connected anti-serially to the second semiconductor switch. Anti-serially can here be understood as meaning that the two components (i.e. the semiconductor switches) are connected in series with opposite polarity. The two semiconductor switches connected in this way can form a second semiconductor switch pair and can be referred to as such. The semiconductor switches of the second semiconductor switch pair can be controlled by the second control signal. For example, in each case the same terminal, for example the gate terminal, of the semiconductor switches of the second semiconductor switch pair can be controlled by the second control signal.

The system can have a first voltage divider circuit. The first voltage divider circuit can have the first resistor and at least one further resistor. One end of the first voltage divider circuit can be connected between the first semiconductor switch and the first semiconductor device. Another end of the first voltage divider circuit can be connected to a reference potential, for example to ground. The first resistor can be, for example, the resistor of the voltage divider circuit that is connected directly to the reference potential, for example to ground. With the aid of the voltage divider circuit, the voltage across the first resistor can, for example, be brought/reduced to a value which can be inputted into and processed by a first comparison component, which will be explained hereinbelow.

The system can have a second voltage divider circuit. The second voltage divider circuit can have the second resistor and at least one further resistor. One end of the second voltage divider circuit can be connected between the second semiconductor switch and the second semiconductor device. Another end of the second voltage divider circuit can be connected to a reference potential, for example to ground. The second resistor can be, for example, the resistor of the voltage divider circuit that is connected directly to the reference potential, for example to ground. With the aid of the voltage divider circuit, the voltage across the second resistor can, for example, be brought/reduced to a value which can be inputted into and processed by a second comparison component, which will be explained hereinbelow.

The determination unit can have a first comparison component. The first comparison component can be configured to determine a first comparison profile by comparing the profile of the first voltage with a profile of a reference voltage that drops across a reference resistor. One end of the reference resistor can be connected to a voltage source. Another end of the reference resistor can be connected to a/the reference potential, for example to ground. The voltage source can be connected to the first semiconductor switch, the first semiconductor device, the second semiconductor switch and/or the second semiconductor device.

The system can have a reference voltage divider. The reference voltage divider can have the reference resistor and at least one further resistor. In other words, the reference resistor can be part of the reference voltage divider. One end of the reference voltage divider can be connected to a or the voltage source. Another end of the reference voltage divider can be connected to the reference potential, for example to ground. The reference resistor can be, for example, the resistor of the reference voltage divider that is connected directly to the reference potential, for example to ground.

The first comparison component can have a first comparator or be in the form of a first comparator. The first comparator can be formed/implemented by one or more operational amplifiers and further components. The first comparison component can be configured to determine a first comparison profile of the electrical variable of the first semiconductor switch with a reference value or reference value profile. The comparison profile can be determined, for example, by comparing the profile of the first voltage with the profile of the reference voltage that drops across the reference resistor. This applies regardless of whether the reference resistor is or is not part of a or the reference voltage divider. The reference voltage can be largely constant.

The determination unit can have a second comparison component. The second comparison component can be configured to determine a second comparison profile by comparing the profile of the second voltage with a profile of a reference voltage that drops across a reference resistor. The second comparison component can have a second comparator or be in the form of a second comparator. The second comparator can be formed/implemented by one or more operational amplifiers and further components. The second comparison component can be configured to determine a second comparison profile of the electrical variable of the second semiconductor switch with a reference value or reference value profile. The comparison profile can be determined, for example, by comparing the profile of the second voltage with the profile of the reference voltage that drops across the reference resistor. The reference voltage can be largely constant.

The determination unit can have a first logic component. The first logic component can be configured to determine a first logic signal by combining the first comparison profile with the first control signal. The first logic component can have an exclusive OR gate (XOR gate) or be in the form of an XOR gate.

The determination unit can have a second logic component. The second logic component can be configured to determine a second logic signal by combining the second comparison profile with the second control signal. The second logic component can have an XOR gate or be in the form of an XOR gate, for example.

The determination unit can further have a third logic component. The third logic component can be configured to determine an output signal by combining the first logic signal with the second logic signal. The third logic component can have an OR gate or be in the form of an OR gate.

The system can further have a time-delay element, also referred to herein as a delay element for short. The delay element can be configured to determine a fault signal by applying a switch-on delay. The delay element can be configured to determine a fault signal by combining the output signal with a switch-on delay. With the aid of the delay element, incorrect diagnoses caused by signal transit times and switching delays can at least be reduced if not entirely prevented.

The system can have a phase generator. The phase generator can be configured to generate the first control signal from a clock signal, for example. Additionally or alternatively, the phase generator can be configured to generate the second control signal from the clock signal, for example. The phase generator can thereby be configured to switch on the semiconductor switches that are present alternately.

Although mention is made herein of a first and a second semiconductor switch, the invention is not limited to the identification of a non-switching semiconductor switch from exactly two semiconductor switches connected in parallel. For example, three or more than three semiconductor switches can also be connected in parallel. In other words, a system for identifying a non-switching semiconductor switch from at least two semiconductor switches connected in parallel can be provided. For example, the first semiconductor switch, the second semiconductor switch and at least a third semiconductor switch can be connected in parallel with one another. In this case, the system can identify a non-switching semiconductor switch from the first semiconductor switch, the second semiconductor switch and the at least a third semiconductor switch. If the first and/or second semiconductor switch can no longer be transferred from an open state into a closed state, a kind of emergency operation can be ensured by means of the at least a third semiconductor switch. Without the at least a third semiconductor switch, a load would be switched off at least for a short time in the above-mentioned case.

If the first semiconductor device and the second semiconductor device are each in the form of a semiconductor switch and accordingly form a semiconductor switch pair, although mention is made herein of a first and a second semiconductor switch pair, the invention is not limited to the identification of a non-switching semiconductor switch of a semiconductor switch pair or of a semiconductor switch pair from exactly two semiconductor switch pairs connected in parallel. For example, three or more than three semiconductor switch pairs can also be connected in parallel. In other words, a system for identifying a non-switching semiconductor switch or semiconductor switch pair from at least two semiconductor switch pairs connected in parallel can be provided. For example, the first semiconductor switch pair, the second semiconductor switch pair and at least a third semiconductor switch pair can be connected in parallel with one another. In this case, the system can identify a non-switching semiconductor or a non-switching semiconductor switch pair from the first semiconductor switch pair, the second semiconductor switch pair and the at least a third semiconductor switch pair. If the first and/or second semiconductor switch pair can no longer be transferred from an open state into a closed state, a kind of emergency operation can be ensured by means of the at least a third semiconductor switch pair. Without the at least a third semiconductor switch pair, a load would be switched off at least for a short time in the above-mentioned case.

The system can be part of a power distribution system, such as, for example, a power distribution system with high demands in terms of functional safety and/or reliability. In power distribution systems generally, and in those with high safety demands in particular, it is important to be able to identify and/or verify the functionality of the semiconductor switches used, in particular without adversely affecting a load, which is preferably connected downstream of a semiconductor switch, during operation.

The first semiconductor switch can be in the form of a power semiconductor/power semiconductor switch. Additionally or alternatively, the second semiconductor switch can be in the form of a power semiconductor/power semiconductor switch. For example, all the semiconductor switches of the parallel-connected semiconductor switch pairs that are present can be in the form of power semiconductors/power semiconductor switches. The system can be embedded in a power distributor of a complete system, such as, for example, can be part of a power distributor of a complete system. The complete system can have at least one voltage source for current supply (power supply) and at least one consumer. The power distributor can be located between the at least one voltage source and the at least one consumer. The power distributor can distribute the current provided by the at least one voltage source to the at least one consumer. The first semiconductor switch and/or the second semiconductor switch can be arranged in the power distributor in order to switch on (connect to the at least one voltage source) or switch off (disconnect from the at least one voltage source) the at least one consumer. At least one voltage source and/or at least one consumer can be arranged both on the input side and on the output side of the power distributor.

Arranging the semiconductor switches anti-serially in pairs, that is to say forming semiconductor switch pairs, has the advantage of bidirectional operation. Thus, the system can have, for example, two voltage sources, for example a voltage source on each of the input side and the output side. The system can further have two consumers, for example a consumer on each of the input side and the output side. The first semiconductor switch of the first semiconductor switch pair can be arranged, for example, to switch on (connect to the voltage supply) or switch off (disconnect from the voltage supply) a first consumer. The further semiconductor switch of the first semiconductor switch pair can be arranged, for example, to switch on (connect to the voltage supply) or switch off (disconnect from the voltage supply) a further consumer. The second semiconductor switch pair can function correspondingly and provide redundancy for the system.

The first semiconductor switch can be in the form of a field-effect transistor. The first semiconductor device can be in the form of a diode or in the form of a field-effect transistor. The second semiconductor switch can be in the form of a field-effect transistor. The second semiconductor device can be in the form of a diode or in the form of a field-effect transistor.

According to a second aspect of the invention, a method for identifying a non-switching semiconductor switch is provided. The method comprises controlling a first semiconductor switch by means of a first control signal. The method further comprises controlling a second semiconductor switch, which is connected in parallel with the first semiconductor switch, by means of a second control signal. The method further comprises identifying, on the basis of a profile of a first voltage drop across a first resistor, whether the first semiconductor switch does not switch. One end of the first resistor is connected between the first semiconductor switch and a first semiconductor device. Another end of the first resistor is connected to a reference potential, for example to ground. The first semiconductor device is configured and arranged to prevent a current flow through the first semiconductor device at least in one direction. The method comprises identifying, on the basis of a profile of a second voltage drop across a second resistor, whether the second semiconductor switch does not switch. One end of the second resistor is connected between the second semiconductor switch and a second semiconductor device. Another end of the second resistor is connected to the reference potential, for example to ground. The second semiconductor device is configured and arranged to prevent a current flow through the second semiconductor device at least in one direction.

Although some of the aspects described hereinbefore have been described in relation to the system, these aspects can also be implemented in a corresponding manner in the method.

Figure 2:
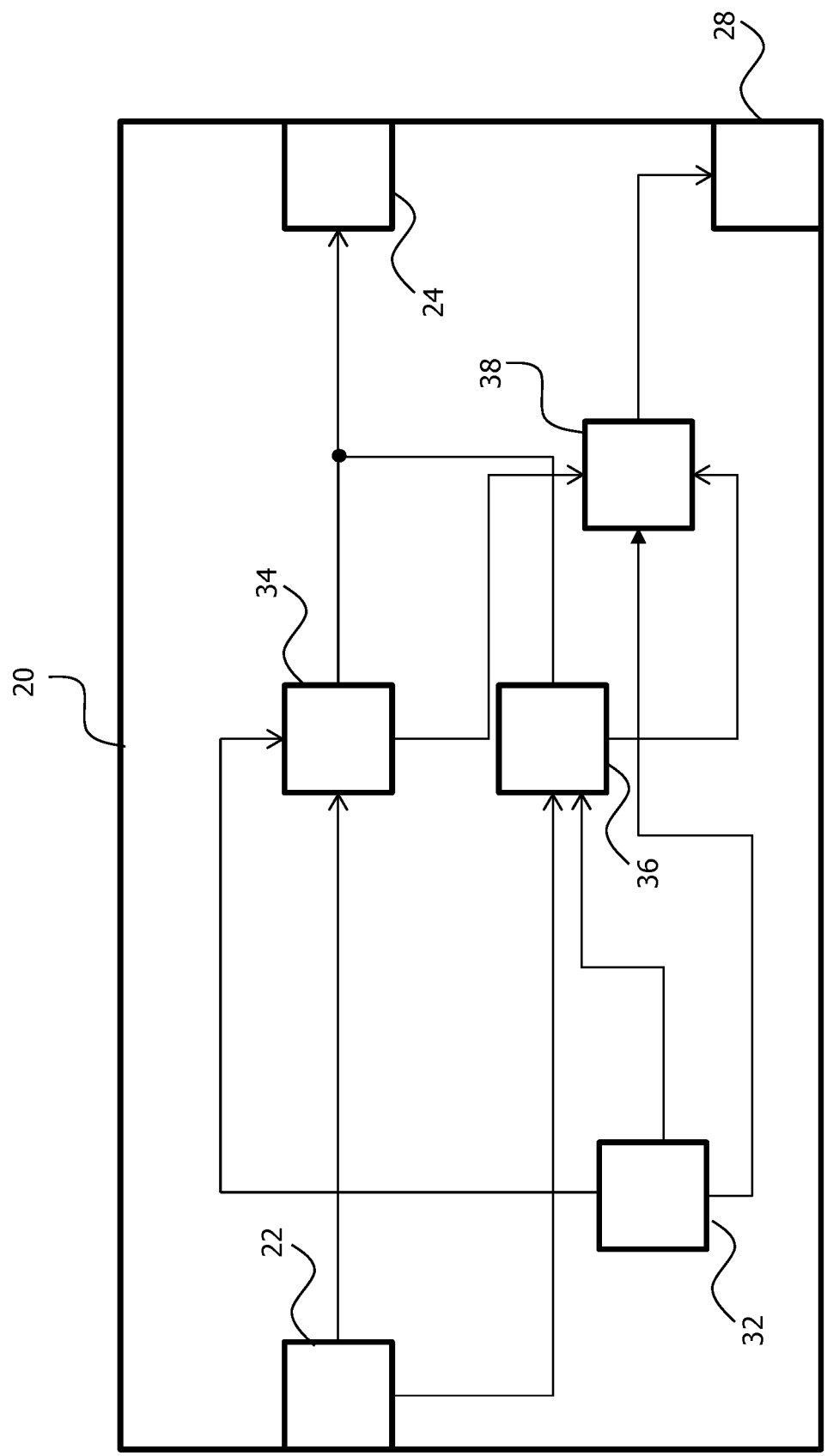
Figure 3A:
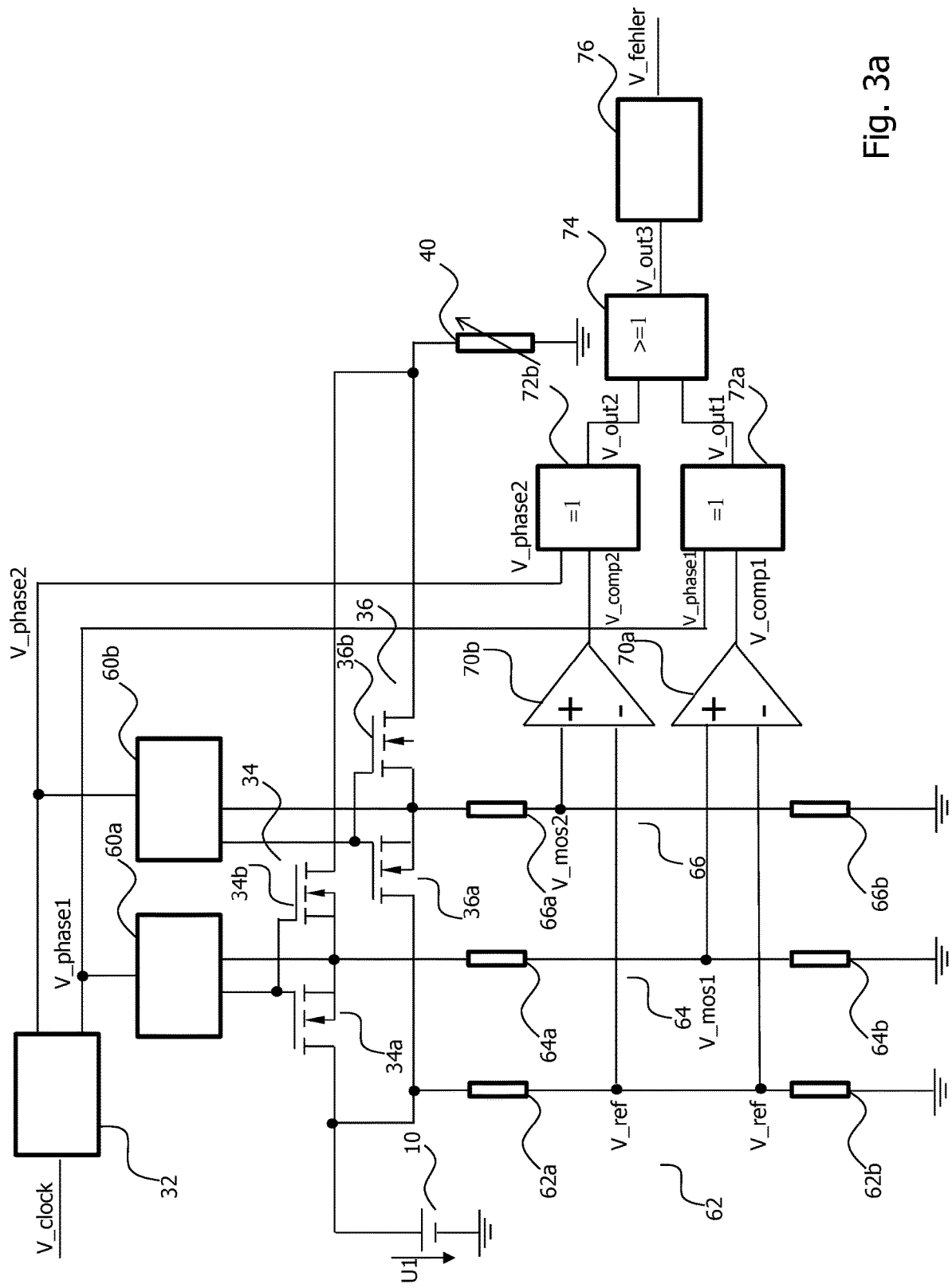
Figure 3B:
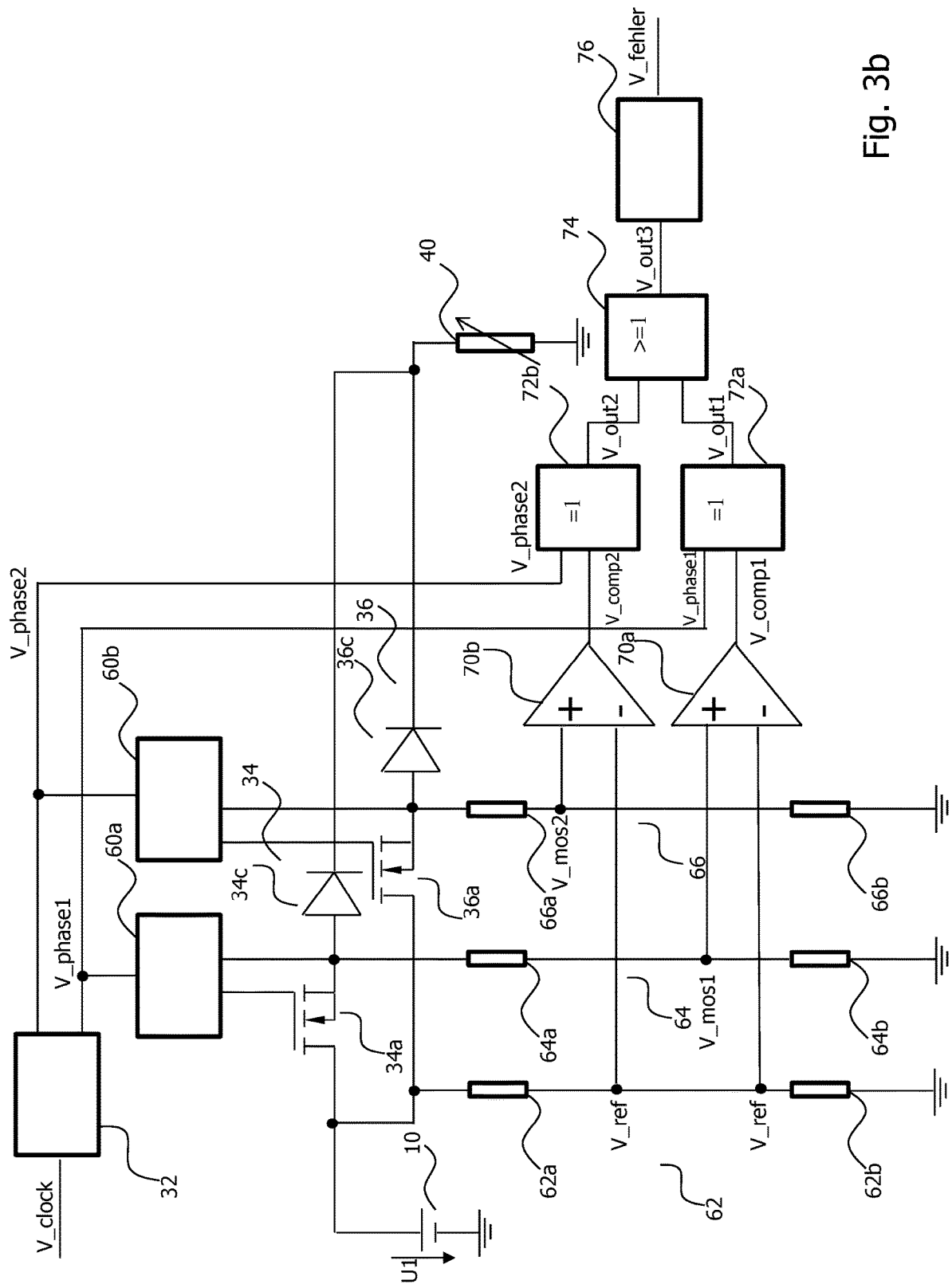
Figure 4A:
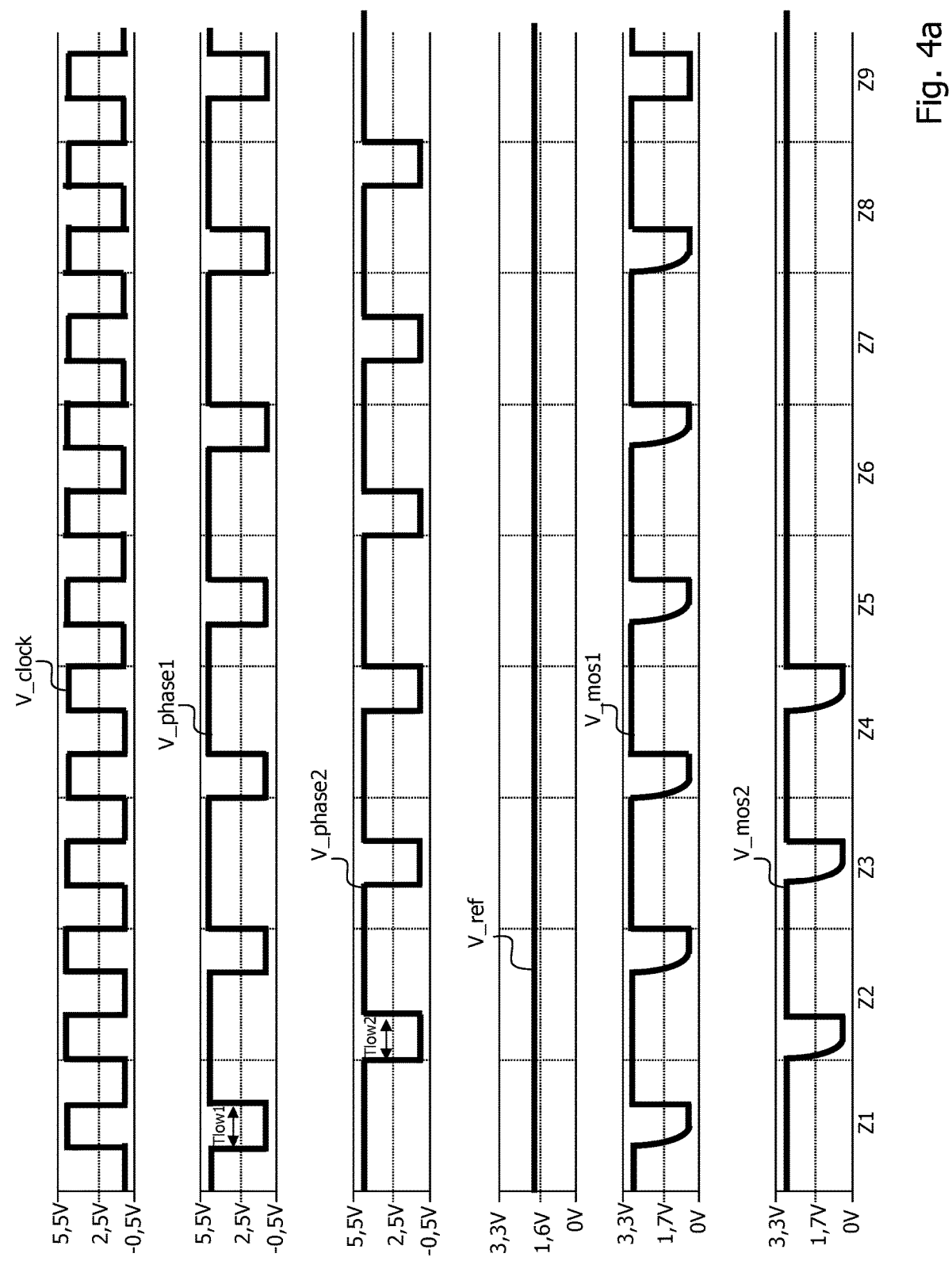

The present disclosure is to be explained further with reference to figures. These figures show, in diagrammatic form:

FIG. 1 a complete system with a current supply, a power distributor and an electric consumer;

FIG. 2 a possible configuration of a power distributor from FIG. 1;

FIG. 3*a* a possible configuration of a switching system according to an exemplary embodiment which can be used in the power distributor of FIG. 2;

FIG. 3*b* a possible configuration of a switching system according to an exemplary embodiment which can be used in the power distributor of FIG. 2; and FIGS. 4*a, b* exemplary signal profiles of electrical variables for use in the system of FIG. 3*a* or 3*b*.

Specific details are set out in the following text, without being limited thereto, in order to provide a complete understanding of the present disclosure. However, it will be clear to a person skilled in the art that the present disclosure can be used in other exemplary embodiments which may differ from the details set out hereinbelow. For example, specific configurations and forms of a system are described in the following text which are not be regarded as limiting.

FIG. 1 shows, in diagrammatic form, a power distribution system having a voltage source as a current supply 10, a power distributor 20 and an electric consumer 40. The voltage source 10 has a positive terminal 12 and a negative terminal 14. The power distributor 20 has a positive terminal 22 and a negative terminal 26 on the input side. The power distributor 20 further has a positive terminal 24 on the output side. The power distributor 20 has a switching system 30 with which the consumer 40 can be switched on and off. The switching system 30 has a controller 28. The controller 28 can be a higher-level controller. The electric consumer 40 has a positive terminal 42 and a negative terminal 44.

The negative terminal 14 of the voltage source 10, the negative terminal 26 of the power distributor 20 and the negative terminal 44 of the consumer 40 are each connected to earth/ground 50. The voltage source 10, the power distributor 20 and the consumer 40 thus have the same reference potential, in the present case, for example, ground/earth 50.

The voltage source 10 is connected via its positive terminal 12 to the positive terminal 22 on the input side of the power distributor 20. Additionally or alternatively, a voltage source as the current supply can be connected to the power distributor 10 on the output side. The power distributor 20 is connected on the output side via its positive terminal 24 on the output side to the electric consumer 40. Although, by way of example, only one consumer 40 is shown, a plurality of electric consumers 40 can be connected in this way to the power distributor 20, for example via further positive terminals (not shown in FIG. 1) on the output side of the power distributor 20. Additionally or alternatively, one or more consumers can also be connected to the power distributor 20 on the input side. The switching system 30 is configured to switch the electric consumer 40 on and off. Where there is a plurality of electric consumers, the system is correspondingly configured to switch each of a plurality of electric consumers on and off. If switching off is not possible, the switching system 30 provides a corresponding fault message to the controller 28. The power distribution system can be in particular a power distribution system with high demands in terms of safety (and/or high demands in terms of reliability). In such systems, it is all the more important to be able to verify the functionality of the switches used (for switching the consumer 40 on and off).

If a voltage source as the power supply and also one or more consumers are arranged both on the input side and on the output side, it is advantageous if the power distributor 20 is able to work bidirectionally.

FIG. 2 shows an exemplary configuration of a power distributor 20 from FIG. 1. The power distributor 20 has a positive terminal 22 on the input side. The power distributor 20 further has a positive terminal 24 on the output side. The power distributor further has a controller 28. The negative terminal of the power distributor from FIG. 1 is not shown in FIG. 2 for the sake of simplicity. In FIG. 2, an exemplary configuration of the switching system 30 from FIG. 1 is shown. According to this example, the switching system 30 has a phase generator 32, a first semiconductor switch pair 34, a second semiconductor switch pair 36, and a determination unit 38, which can have, for example, two comparators. The first semiconductor switch pair 34 and the second semiconductor switch pair 36 serve to switch the electric consumer 40 on and off. The switch-off functionality in particular is to be monitored for reliability. The first semiconductor switch pair 34 and the second semiconductor switch pair 36 are connected in parallel with one another.

The phase generator 32 controls the first semiconductor switch pair 34 and the second semiconductor switch pair 36, for example in each case with the aid of a control signal that is generated. The first semiconductor switch pair 34 is controlled by a first control signal. The second semiconductor switch pair 36 is controlled by a second control signal. As will be explained in greater detail hereinbelow in relation to FIGS. 3a and 3b, a profile of a first voltage drop across a resistor that is connected to the first semiconductor switch pair 34 is determined. A profile of a second voltage drop across a resistor that is connected to the second semiconductor switch pair 36 is further determined.

On the basis of the profile of the first voltage drop across the resistor that is connected to the first semiconductor switch pair 34, the determination unit 38 can identify a fault in the switching of the first semiconductor switch pair 34. On the basis of the profile of the second voltage drop across the resistor that is connected to the second semiconductor switch pair 36, the determination unit 38 can identify a fault in the switching of the second semiconductor switch pair 36. For example, the acquired voltages can each be compared with a reference voltage value in the determination unit 38. The determination unit 38 can generate an output signal from each of the voltages. It can be deduced from this output signal whether or not the first semiconductor switch pair 34 and/or the second semiconductor switch pair 36 actually switches/switch as intended, in particular switches off/switch off or is/are able to be switched off as intended. If a fault in switching, in particular in switching off, is detected, the controller 28, for example, is informed. The controller 28, as a higher-level body, for example, can take corresponding measures, such as, for example, can itself switch off the electric consumer 40 or disconnect it from the power distributor 20 or transfer it into a safe state.

FIG. 3a shows a specific configuration, more specifically a possible circuit in the form of a hardware implementation, of the switching system 30. The switching system 30 has a phase generator 32. The phase generator 32 is configured to generate a first control signal V_phase1 and a second control signal V_phase2 from a clock signal. The first control signal V_phase1 is inputted into a first gate driver 60a. The second control signal V_phase2 is inputted into a second gate driver 60b. The first gate driver 60a is connected to the gate terminal of a first semiconductor switch pair 34. The first semiconductor switch pair 34 has two semiconductor switches, namely a semiconductor switch 34a and, as an example of a semiconductor device, a semiconductor switch 34b, both of which are in the form of MOSFETs in the example of FIG. 3a and are accordingly referred to in the following text as MOSFET 34a and MOSFET 34b. Accordingly, the semiconductor switch pair 34 is referred to in relation to FIG. 3a by way of example as the first MOSFET pair 34a. The second gate driver 60b is connected to the gate terminal of a second semiconductor switch pair 36. The second semiconductor switch pair 36 has two semiconductor switches, namely a semiconductor switch 36a and, as an example of a semiconductor device, a semiconductor switch 36b, both of which are in the form of MOSFETs in the example of FIG. 3a and are accordingly referred to in the following text as MOSFET 36a and MOSFET 36b. Accordingly, the semiconductor switch pair 36 is referred to in relation to FIG. 3a by way of example as the second MOSFET pair 36.

The drain terminal of the MOSFET 34a of the first MOSFET pair 34 is connected to a voltage source 10, which supplies the switching system 30 with current. Alternatively, the drain terminal of the MOSFET 34a of the first MOSFET pair 34 can be connected to a load. Furthermore, in addition to the voltage source 10, a load can be provided on the input side of the circuit, so that in this case the drain terminal of the MOSFET 34a of the first MOSFET pair 34 would be connected to the voltage source 10 and to a load.

A MOSFET 34b of the first MOSFET pair 34 is connected anti-serially to the MOSFET 34a of the first MOSFET pair 34. In this specific case of MOSFETS, anti-serially means that, although the two MOSFETs 34a, 34b are connected in series, the source terminals of the two MOSFETs 34a, 34b are connected together. The two MOSFETS 34a, 34b thereby differ in their blocking direction, that is to say in the direction in which they block. Although not apparent in the figures, the MOSFETs 34a, 34b can each intrinsically have/ comprise, for technological reasons, a so-called parasitic bulk diode, parallel to the switchable channel. This bulk diode prevents the MOSFET 34a, 34b in question from being able to block in the forward direction of the bulk diode. The MOSFET pair 34 therefore ensures blocking in both directions. In other words, in contrast to only one MOSFET, the presence of the MOSFET pair 34 (with the two anti-serial MOSFETs 34a, 34b) makes it possible for blocking to take place in both directions.

The source terminal of the MOSFET 34a of the first MOSFET pair 34 is accordingly connected to the source terminal of the MOSFET 34b of the first MOSFET pair 34. The drain terminal of the MOSFET 34b of the first MOSFET pair 34 is connected to ground/earth as the reference potential via a variable resistor, which illustrates the load 40 from FIG. 1 in the circuit of FIG. 3a and accordingly is likewise designated by the reference numeral 40. That is so say, in FIG. 3a the drain terminal of the MOSFET 34b of the first MOSFET pair 34 is connected to the load 40. Alternatively, the drain terminal of the MOSFET 34b of the first MOSFET pair 34 can be connected to a voltage source. Furthermore, in addition to the load 40, a voltage source can be provided on the output side of the circuit, so that in this case the drain terminal of the MOSFET 34b of the first MOSFET pair 34 would be connected to the load 40 and to a voltage source. In particular in switching systems for automotive assemblies, both a voltage source and a load are often provided on the input side and on the output side, that is to say on both sides, for redundancy reasons.

The drain terminal of the MOSFET 36a of the second MOSFET pair 36 is connected to the voltage source 10. Alternatively, the drain terminal of the MOSFET 36a of the second MOSFET pair 36 can be connected to a load. Furthermore, in addition to the voltage source 10, a load can be provided on the input side of the circuit, so that in this case the drain terminal of the MOSFET 36a of the second MOSFET pair 36 would be connected to the voltage source 10 and to a load.

A MOSFET 36b of the second MOSFET pair 36 is connected anti-serially to the MOSFET 36a of the second MOSFET pair 36. Here too, anti-serially means that, although the two MOSFETs 36a, 36b are connected in series, the source terminals of the two MOSFETs 36a, 36b are connected together. In this case too, the anti-serial connection of the MOSFETs 36a, 36b to form a MOSFET pair 36 ensures blocking in both directions owing to the respective parasitic bulk diode. In other words, in contrast to only one MOSFET, the presence of the MOSFET pair 36 (with the two anti-serial MOSFETs 36a, 36b) makes it possible for blocking to take place in both directions.

The source terminal of the MOSFET 36a of the second MOSFET pair 36 is accordingly connected to the source terminal of the MOSFET 36b of the second MOSFET pair 36. The drain terminal of the MOSFET 36b of the second MOSFET pair 36 is connected to ground/earth as the reference potential via the load 40 (also referred to as the consumer 40). That is to say, in FIG. 3a the drain terminal of the MOSFET 36b of the second MOSFET pair 36 is connected to the load 40. Alternatively, the drain terminal of the MOSFET 36a of the second MOSFET pair 36 can be connected to a voltage source. Furthermore, in addition to the load 40, a voltage source can be provided on the output side of the circuit, so that in this case the drain terminal of the MOSFET 36b of the second MOSFET pair 36 can be connected to the load 40 and to a voltage source.

There are further shown in FIG. 3a three voltage divider circuits 62, 64, 66, which are referred to in the following text as voltage dividers 62, 64, 66 for short. The voltage divider 62 can also be referred to as a reference voltage divider 62 and in the example of FIG. 3a has exactly two reference resistors 62a, 62b. In the example of FIG. 3a, the voltage divider 64 has exactly two resistors 64a, 64b. One end of the voltage divider 64 is connected between the two MOSFETs 34a, 34b of the first MOSFET pair 34 or, in other words, is connected to a connection of the source terminals of the MOSFETs 34a, 34b of the first MOSFET pair 34. Another end of the voltage divider 64 is connected to ground as the reference potential. In the example of FIG. 3a, the voltage divider 66 has exactly two resistors 66a, 66b. One end of the voltage divider 66 is connected between the two MOSFETS 36a, 36b of the second MOSFET pair 36 or, in other words, is connected to a connection of the source terminals of the MOSFETs 36a, 36b of the second MOSFET pair 36. Another end of the voltage divider 66 is connected to ground as the reference potential.

The voltage dividers 62, 64, 66 can be regarded as part of a specific implementation of the determination unit 38 (e.g. of FIG. 2). The voltage drop across the voltage divider 62 always has a value which corresponds to the value of the voltage U1 of the voltage source 10. Accordingly, the voltage drop across the voltage divider 62 is known. The voltage drop across each of the resistors 62a, 62b is known from the ratio of the resistance values of the resistors 62a, 62b. If, for example, the resistance values of the resistors 62a, 62b are equal, the voltage drop across each of the resistors 62a, 62b is equal, more precisely is in each case half the voltage of the voltage source 10. Generally, the voltage drop across the resistor 62b has the following known voltage divider formula:

$$U\_wid62b = U1 * R\_wid62b / (R\_wid62a + R\_wid62b),$$

wherein U_wid62b denotes the voltage drop across the resistor 62b, U1 denotes the voltage of the voltage source 10, R_wid62a denotes the resistance value of the resistor 62a, and R_wid62b denotes the resistance value of the resistor 62b.

The voltage drop across the voltage divider 64 is different according to whether the MOSFETs 34a, 34b of the first MOSFET pair 34 are closed or open. If the MOSFETS 34a, 34b of the first MOSFET pair 34 are in a closed state, the voltage drop across the voltage divider 64 has a value which corresponds to the value of the voltage of the voltage source 10. The voltage drop across each of the resistors 64a, 64b is given by the ratio of the resistance values of the resistors 64a, 64b. If, for example, the resistance values of the resistors 64a, 64b are equal, the voltage drop across each of the resistors 64a, 64b is equal, more specifically, in the case of closed MOSFETs 34a, 34b of the first MOSFET pair 34, in each case half the voltage U1 of the voltage source 10. If the MOSFETs 34a, 34b of the first MOSFET pair 34 are in an open state, the voltage drop across the MOSFET 34a of the first MOSFET pair 34 is relatively high and the voltage drop at the voltage divider 64 is thus significantly lower than in the case of a closed MOSFET 34a. In the case of an open MOSFET 34a, the voltage drop across the voltage divider 64 may even approach 0V or be 0V. The voltage drop across each of the resistors 64a, 64b is given by the ratio of the resistance values of the resistors 64a, 64b and is then likewise very low or even at least virtually 0V. If, for example, the resistance values of the resistors 64a, 64b are equal, the voltage drop across each of the resistors 64a, 64b is equal but very low, more specifically, in the case of an open MOSFET 34a, 34b of the first MOSFET pair 34, in each case a very low voltage of, for example, at least virtually 0V.

The voltage drop across the voltage divider 66 is different according to whether the MOSFETs 36a, 36b of the second MOSFET pair 36 are closed or open. If the MOSFETs 36a, 36b of the second MOSFET pair 36 are in a closed state, the voltage drop at the voltage divider 66 has a value which corresponds to the value of the voltage of the voltage source 10. The voltage drop across each of the resistors 66a, 66b is given by the ratio of the resistance values of the resistors 66a, 66b. If, for example, the resistance values of the resistors 66a, 66b are equal, the voltage drop across each of the resistors 66a, 66b is equal, more specifically, in the case of closed MOSFETs 36a, 36b of the second MOSFET pair 36, in each case half the voltage U1 of the voltage source 10. If the MOSFETs 36a, 36b of the second MOSFET pair 36 are in an open state, the voltage drop across the MOSFET 36a of the second MOSFET pair 36 is relatively high and the voltage drop at the voltage divider 66 is thus significantly lower than in the case of a closed MOSFET 36a. In the case of an open MOSFET 36a, the voltage drop across the voltage divider 66 may even approach 0V or be 0V. The voltage drop across each of the resistors 66a, 66b is given by the ratio of the resistance values of the resistors 66a, 66b and is then likewise very low or even at least virtually 0V. If, for example, the resistance values of the resistors 66a, 66b are equal, the voltage drop across each of the resistors 66a, 66b is equal but very low, more specifically, in the case of an open MOSFET 36a, 36b of the second MOSFET pair 36, in each case a very low voltage of, for example, at least virtually 0V.

The voltage drops across the resistors 62b, 64b, 66b that are connected to ground of the three voltage dividers 62, 64, 66 are inputted into two comparators 70a, 70b. More specifically, the reference voltage V_ref that drops across the reference resistor 62b is inputted into the negative (inverting) input of a first comparator 70a and into the negative (inverting) input of a second comparator 70b. Furthermore, the voltage V_mos1 that drops across the resistor 64b of the voltage divider 64 is inputted into a positive (non-inverting) input of the first comparator 70a. Furthermore, the voltage V_mos2 that drops across the resistor 66b of the voltage divider 66 is inputted into a positive (non-inverting) input of the second comparator 70b. Both the negative (inverting) input of the first comparator 70a and the negative (inverting) input of the second comparator 70b are thus fed with the same reference voltage V_ref.

In the example shown in FIG. 3a, the comparators 70a, 70b are in the form of non-inverting comparators. In such a non-inverting comparator, the reference voltage, that is to say in the case of FIG. 3a the reference voltage V_ref, is connected to the inverting input of the comparator. The input signal, here the respective profile of the voltage V_mos1 across the resistor 64b of the voltage divider 64 and the voltage V_mos2 across the resistor 66b of the voltage divider 66, is in each case connected to the non-inverting input of the comparator. In a non-inverting comparator, a digital 0 (a LOW level) is outputted as the output if the input voltage is smaller than the reference voltage. By contrast, if the input voltage is equal to or greater than the reference voltage, a digital 1 (a HIGH level) is outputted. Alternatively, it would be possible to provide inverting comparators in FIG. 3a. The comparators 70a, 70b can each be composed of one or more operational amplifiers and/or further components.

The output of the first comparator 70a is connected to a first XOR gate 72a. The first XOR gate 72a thus receives the output signal V_comp1 of the first comparator 70a as a first input variable. The output of the second comparator 70b is connected to a second XOR gate 72b. The second XOR gate 72b thus receives the output signal V_comp2 of the second comparator 70b as a first input variable. The first XOR gate 72a receives the first control signal V_phase1 as a second input variable. The second XOR gate 72b receives the second control signal V_phase2 as a second input variable. The first XOR gate 72a accordingly implements an XOR operation of the output of the first comparator 70a (signal V_comp1) and the first control signal V_phase1. The second XOR gate 72b accordingly implements an XOR operation of the output of the second comparator 70b (signal V_comp2) and the second control signal V_phase2.

The outputs of the first XOR gate 72a (signal V_out1) and of the second XOR gate 72b (signal V_out2) are inputted into an OR gate 74 as input variables. The output of the OR gate 74 is therefore an overlay of the outputs of the first and second XOR gates 72a, 72b. Problems or faults in the switching of the first MOSFET pair 34a and/or of the second MOSFET pair 34b can be deduced, for example, from the output signal of the OR gate (signal V_out3).

The identification of a fault in switching can be improved by connecting a time-delay element 76 downstream of the OR gate 74. This can be achieved in that so-called spikes (spikes can be understood as being short peaks, i.e. peaks with a duration below a predefined time threshold) are excluded by the time delay 76. The time-delay element 76 has the result that only abnormalities with a duration above a predefined time threshold are identified as faults. The signal outputted by the time-delay element 76 can consequently be referred to as a fault signal V_fehler. In other words, the time-delay element 76 can be referred to as a switch-on delay which has the result that only fault signals or peaks of a fault signal above a specific length are evaluated as valid, that is to say as actual/valid faults.

With reference to FIG. 3a, the determination unit from FIG. 2 can be implemented, for example, by the voltage dividers 62, 64, 66, the comparators 70a, 70b, the XOR gates 72a, 72b and the OR gate 74 from FIG. 3a. Alternative implementations are possible in which one or more of the above-mentioned components are omitted or replaced and/ or further components are added. FIG. 3a is thus to be regarded merely as an example of a hardware implementation of the switching system of FIG. 2.

FIG. 3b shows a variant of the specific configuration of FIG. 3a, more specifically a variant of a possible circuit as a hardware implementation of the switching system of FIG. 2. The variant of FIG. 3b differs from the configuration of FIG. 3a in that a semiconductor diode 34c, 36c is in each case used instead of a MOSFET 34b of the first MOSFET pair 34 and instead of a MOSFET 36b of the second MOSFET pair 36. In the example of FIG. 3b, the MOSFET 34b and the MOSFET 36b are each replaced by a semiconductor diode. Alternatively, the MOSFET 34a and the MOSFET 36a could each be replaced by a semiconductor diode 34c, 36c. Combinations are possible. In FIG. 3b, there are thus no MOSFET pairs as in FIG. 3a but rather semiconductor device pairs 34, 36. Each of the semiconductor device pairs 34, 36 of FIG. 3b has a MOSFET 34a, 36a and a semiconductor diode 34b, 36b.

The following applies in FIG. 3b with regard to the voltage values V_ref, V_mos1, V_mos2 inputted into the comparators 70a, 70b.

The voltage drop across the voltage divider 62 always has a value which corresponds to the value of the voltage U1 of the voltage source 10. The voltage drop across the voltage divider 62 is thus known. The voltage drop across each of the resistors 62a, 62b is known from the ratio of the resistance values of the resistors 62a, 62b. If, for example, the resistance values of the resistors 62a, 62b are equal, the voltage drop across each of the resistors 62a, 62b is equal, more specifically in each case half the voltage of the voltage source 10.

The voltage drop across the voltage divider 64 is different according to whether the MOSFET 34a of the first semiconductor device pair 34 is closed or open. If the MOSFET 34a of the first semiconductor device pair 34 is in a closed state, the voltage drop across the voltage divider 64 has a value which corresponds to the value of the voltage U1 of the voltage source 10. The voltage drop across each of the resistors 64a, 64b is given by the ratio of the resistance values of the resistors 64a, 64b. If, for example, the resistance values of the resistors 64a, 64b are equal, the voltage drop across each of the resistors 64a, 64b is equal, more specifically, in the case of a closed MOSFET 34a of the first semiconductor device pair 34, in each case half the voltage of the voltage source 10. If the MOSFET 34a of the first MOSFET pair 34 is in an open state, the voltage drop across the MOSFET 34a of the first MOSFET pair 34 is relatively high, and the voltage drop at the voltage divider 64 is thus significantly lower than in the case of a closed MOSFET 34a.

In the case of an open MOSFET 34a, the voltage drop across the voltage divider 64 may even approach 0V or be 0V. However, a current flow in the direction of the voltage divider 64 could change this value considerably and thus lead to falsification of the measurement results. Owing to the high resistance of the open MOSFET 34a, the current flow would flow to a considerable degree, if not even exclusively, via the voltage divider 64. Such a current flow can originate, for example, from the path with the closed MOSFET 36a. Additionally or alternatively, such a current flow can be a return flow from the load 40. Additionally or alternatively, such a current flow can originate from a voltage source which is connected on the output side instead of or in addition to the load 40. The semiconductor diode 34a if necessary ensures that no or at least virtually no current flows into the voltage divider 64 in the blocking direction of the semiconductor diode 34c when the MOSFET 34a is open. The voltage drop across each of the resistors 64a, 64b is given by the ratio of the resistance values of the resistors 64a, 64b and is then likewise very low or even at least virtually 0V. If, for example, the resistance values of the resistors 64a, 64b are equal, there is an equal but very low voltage drop across the resistors 64a, 64b, more specifically, in the case of an open MOSFET 34a of the first semiconductor device pair 34, in each case a very low voltage of, for example, at least virtually 0V.

The voltage drop across the voltage divider 66 is different according to whether the MOSFET 36a of the second semiconductor device pair 36 is closed or open. If the MOSFET 36a of the second semiconductor device pair 36 is in a closed state, the voltage drop across the voltage divider 66 has a value which corresponds to the value of the voltage U1 of the voltage source 10. The voltage drop across each of the resistors 66a, 66b is given by the ratio of the resistance values of the resistors 66a, 66b. If, for example, the resistance values of the resistors 66a, 66b are equal, the voltage drop across each of the resistors 66a, 66b is equal, more specifically, in the case of a closed MOSFET 36a of the second semiconductor device pair 36, in each case half the voltage of the voltage source 10.

If the MOSFET 36a of the second semiconductor device pair 36 is in an open state, the voltage drop across the MOSFET 36a of the second semiconductor device pair 36 is relatively high, and the voltage drop at the voltage divider 66 is thus significantly lower than in the case of a closed MOSFET 36a. In the case of an open MOSFET 36a, the voltage drop across the voltage divider 66 may even approach 0V or be 0V. However, a current flow in the direction of the voltage divider 66 could change this value considerably and thus lead to falsification of the measurement results. Owing to the high resistance of the open MOSFET 36a, the current flow would flow to a considerable degree, if not even exclusively, via the voltage divider 66. Such a current flow can originate, for example, from the path with the closed MOSFET 34a. Additionally or alternatively, such a current flow can be a return flow from the load 40. Additionally or alternatively, such a current flow can originate from a voltage source which is connected on the output side instead of or in addition to the load 40. The semiconductor diode 36c if necessary ensures that no or at least virtually no current flows into the voltage divider 66 in the blocking direction of the semiconductor diode 36c when the MOSFET 34a is open. The voltage drop across each of the resistors 66a, 66b is given by the ratio of the resistance values of the resistors 66a, 66b and is then likewise very low or even at least virtually 0V. If, for example, the resistance values of the resistors 66a, 66b are equal, there is an equal but very low voltage drop across each of the resistors 66a, 66b, more specifically, in the case of an open MOSFET 36a of the second semiconductor device pair 36, in each case a very low voltage of, for example, at least virtually 0V.

The remainder of the circuit of FIG. 3b corresponds to the circuit of FIG. 3a. Accordingly, reference is made in this respect to the above explanations regarding FIG. 3a.

The functioning of the configuration of FIG. 3a will now be described in greater detail with reference to exemplary signal profiles from FIGS. 4a and 4b. The explanations apply correspondingly to the variant of FIG. 3b with the differences described above in relation to FIG. 3b.

Figure 4B:
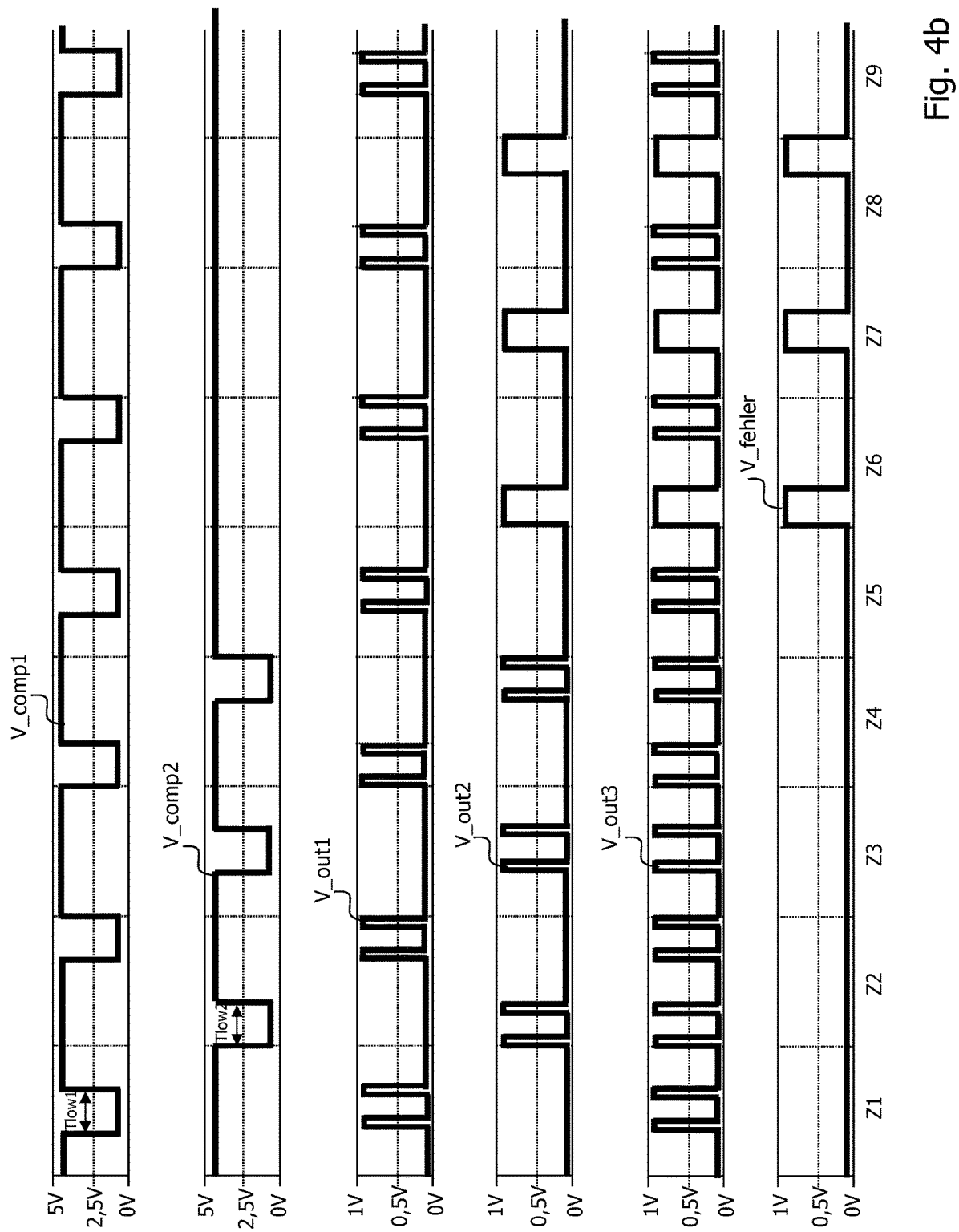

In FIGS. 4a and 4b, signal profiles are in each case shown over time. The ordinate in each case shows the respective electrical variable, for example current or voltage, and the abscissa shows the time. The abscissa is divided into a plurality of regions (more specifically nine regions), which are referred to herein as time slots Z1 to Z9.

In the example, the MOSFETs 34a, 34b, 36a, 36b are in the form of self-locking n-channel MOSFETs. Therefore, the MOSFETs 34a, 34b, 36a, 36b are in an open state and do not conduct current when the voltage between the gate and the source does not exceed a threshold (self-locking; also referred to as enrichment type).

Furthermore, the MOSFETs 34a, 34b, 36a, 36b are in a closed state and conduct current when the voltage between the gate and the source exceeds a threshold. The threshold is in each case below the maximum values of the output signals of the gate drivers 60a, 60b assumed by way of example in FIGS. 4a and 4b.

A clock signal V_clock is inputted into the phase generator 32. An example of such a clock signal V_clock can be seen in FIG. 4a. The phase generator 32 can generate the control signals V_phase1, V_phase2 from the clock signal V_clock. The associated gate drivers 60a, 60b are controlled by the two control signals V_phase1, V_phase2. The two control signals V_phase1, V_phase2 fundamentally have the same profile but are offset by a certain amount relative to one another. As can be seen in relation to the exemplary signal profiles in FIGS. 4a and 4b, the two control signals V_phase1, V_phase2 begin in the first time slot Z1 with a value of approximately 5V. This corresponds to a high level, also referred to as HIGH (digital 1). The gate drivers 60a, 60b convert the control signals to the reference potential of the MOSFETs 34a, 34b and of the MOSFETs 36a, 36b. It can thereby be assumed, by way of example, that the profile of the output signal of the gate driver 60a corresponds to the profile of the control signal V_phase1, wherein the level of the output signal is matched to the MOSFETs 34a, 34b, such as, for example, is reduced compared to the control signal V_phase1. It can further be assumed, by way of example, that the profile of the output signal of the gate driver 60b corresponds to the profile of the control signal V_phase2, wherein the level of the output signal is matched to the MOSFETs 36a, 36b, such as, for example, is reduced compared to the control signal V_phase2. The MOSFETs 34a, 34b and the MOSFETs 36a, 36b each switch on when the voltage between the gate and the source exceeds a specific threshold/threshold voltage. Purely by way of example, 4V may be mentioned here as the threshold. Owing to the HIGH level of the control signals V_phase1, V_phase2 and of the output signals of the gate drivers 60a, 60b, a voltage that exceeds the threshold of the mentioned MOSFETs 34a, 34b, 36a, 36b is present between the gate and the source of the two MOSFETs 34a, 34b of the first MOSFET pair 34 and between the gate and the source of the two MOSFETs 36a, 36b of the second MOSFET pair 36. Both the MOSFETs 34a, 34b of the first MOSFET pair 34 and the MOSFETs 36a, 36b of the second MOSFET pair 36 are therefore in a closed state.

In relation to the exemplary configuration of FIG. 3a, when the MOSFETs 34a, 34b of the first MOSFET pair 34 are closed and when the MOSFETs 36a, 36b of the second MOSFET pair 36 are closed the voltage drop across all the voltage dividers 62, 64, 66 corresponds at least approximately to the voltage U1 of the voltage source 10. This is because the voltage drop across a closed MOSFET is at least virtually 0V. On the basis of the mesh rule, it can be seen that the voltage drop both across the reference voltage divider 62 and across the voltage dividers 64, 66 is in each case at least virtually the voltage U1 of the voltage source 10. In the exemplary case of FIG. 3a, the resistance values of the voltage dividers 62, 64, 66 are such that, when the MOSFETs 34a, 34b of the first MOSFET pair 34 are closed/ switched on and when the MOSFETs 36a, 36b of the second MOSFET pair 36 are closed/switched on, the voltage drop across the resistors 64b, 66b is (significantly) greater than the voltage V_ref that drops across the reference resistor 62b. This can be achieved, for example, in that the ratio of the resistance value 64b to the resistance value 64a is (significantly) greater than the ratio of the resistance value 62b to the resistance value 62a and in that the ratio of the resistance value 66b to the resistance value 66a is (significantly) greater than the ratio of the resistance value 62b to the resistance value 62a. On the basis of the voltage divider rule, the voltage drop across the resistors 64b, 66b is in this case (significantly) greater than the reference voltage V_ref across the resistor 62b, even if the same voltage U1 drops across the respective voltage dividers 62, 64, 66 in total. That is to say, when the MOSFETs 34a, 34b, 36a, 36b are closed, the voltage V_mos1 is (significantly) greater than the reference voltage V_ref and the voltage V_mos2 is (significantly) greater than the reference voltage V_ref. The comparator 70a receives the values for V_mos1, V_ref and the comparator 70b receives the values for V_mos2, V_ref as input values.

After a time, the first control signal V_phase1 is set to a voltage of approximately 0V for a time period Tlow1 in the first time slot Z1. This corresponds to a low level, also referred to as LOW level (digital 0). In this case, the voltage present between the gate and the source of the two MOSFETs 34a, 34b of the first MOSFET pair 34 is, if at all, only very low and is below the threshold of the MOSFETs 34a, 34b. The MOSFETs 34a, 34b therefore change to an open state. During the same time period Tlow1 of the first time slot Z1, the second control signal V_phase2 continues to be at a HIGH level. The MOSFETs 36a, 36b of the second MOSFET pair 36 are therefore still closed. Because the MOSFETs 34a, 34b of the first MOSFET pair 34 are open in the first time period Tlow1 of the first time slot Z1 and the MOSFETs 36a, 36b of the second MOSFET pair 36 are closed in the first time period Tlow1 of the first time slot Z1, the voltage drop across the voltage dividers 64, 66 potentially changes. Because the MOSFETs 36a, 36b of the second MOSFET pair 36 remain closed, the voltage drop across the voltage divider 66 does not change, that is to say the voltage drop across the voltage divider 66 still corresponds substantially to the voltage across the reference voltage divider 62 and thus to the voltage U1 of the voltage source 10. Accordingly, in the case of the chosen resistance ratios of the voltage dividers 62, 64, 66 outlined above, the voltage V_mos2 at/across the resistor 66b is (significantly) above the reference voltage V_ref at/across the resistor 62b.

Because the MOSFETs 34a, 34b of the first MOSFET pair 34 change to an open switching state, the voltage drop across the voltage divider 64 changes. If the MOSFET 34a is open, the voltage drop across the MOSFET 34a is relatively high. By contrast, only a voltage that is significantly lower than the voltage U1 of the voltage source or even a voltage of at least virtually 0V drops across the voltage divider 64. Consequently, the voltage V_mos1 across the resistor 64b is significantly lower than the reference voltage V_ref across the resistor 62b and is, for example, at least virtually 0V. The comparator 70a receives the values for V_mos1, V_ref and the comparator 70b receives the values for V_mos2, V_ref as input values.

If the voltage of the control signal V_phase1 rises to the HIGH level again, the MOSFETs 34a, 34b close again and the voltage drop across the voltage divider 64 again assumes the value of the voltage U1 of the voltage source 10. The comparator 70a receives the values for V_mos1, V_ref and the comparator 70b receives the values for V_mos2, V_ref as input values.

After a time, the second control signal V_phase2 is set to a voltage of approximately 0V for a time period Tlow2 in the second time slot Z2. This corresponds to a low level, also referred to as LOW level (digital 0). In this case, the voltage present between the gate and the source of the two MOSFETs 36a, 36b of the second MOSFET pair 36 is, if at all, only very low and is below the threshold of the MOSFETs 36a, 36b. The MOSFETs 36a, 36b therefore change to an open state. During the same time period Tlow2 of the second time slot Z2, the first control signal V_phase1 continues to be at a HIGH level. The MOSFETs 34a, 34b of the first MOSFET pair 34 are therefore still closed. Because the MOSFETs 36a, 36b of the second MOSFET pair 36 are open in the second time period Tlow2 of the second time slot Z2 and the MOSFETs 34a, 34b of the first MOSFET pair 34 are closed in the second time period Tlow2 of the second time slot Z2, the voltage drop across the voltage dividers 64, 66 potentially changes. Because the MOSFETs 34a, 34b of the first MOSFET pair 34 remain closed, the voltage drop across the voltage divider 64 does not change, that is to say the voltage drop across the voltage divider 64 still corresponds substantially to the voltage across the reference voltage divider 62 and thus to the voltage U1 of the voltage source 10. Accordingly, owing to the choice of the resistance ratios of the voltage dividers 62, 64, 66 outlined above, the voltage V_mos1 at/across the resistor 64b is (significantly) above the reference voltage V_ref at/across the resistor 62b.

Because the MOSFETs 36a, 36b of the second MOSFET pair 36 change to an open switching state, the voltage drop across the voltage divider 66 changes. If the MOSFET 36a is open, the voltage drop across the MOSFET 36a is relatively high. By contrast, only a voltage that is significantly lower than the voltage U1 of the voltage source or even a voltage of at least virtually 0V drops across the voltage divider 66. Consequently, the voltage V_mos2 across the resistor 66b is significantly lower than the reference voltage V_ref across the resistor 62b and is, for example, at least virtually 0V. The comparator 70a receives the values for V_mos1, V_ref and the comparator 70b receives the values for V_mos2, V_ref as input values.

If the voltage of the control signal V_phase2 and the voltage of the output signal of the gate driver 60b rises to the HIGH level again, the MOSFETs 36a, 36b close again and the voltage drop across the voltage divider 66 again assumes the value of the voltage U1 of the voltage source 10. Accordingly, owing to the choice of the resistance values of the voltage dividers 62, 64, 66 outlined above, the voltage V_mos2 at/across the resistor 66b is again (significantly) above the reference voltage V_ref at/across the resistor 62b. The comparator 70a receives the values for V_mos1, V_ref and the comparator 70b receives the values for V_mos2, V_ref as input values.

The profiles of the voltages V_mos1, V_mos2 across the resistors 64b, 66b of the voltage dividers 64, 66 therefore change according to the profiles of the control signals V_phase1, V_phase2, as is shown by way of example in FIG. 4a. The comparators 70a, 70b accordingly receive different input values in dependence on the profiles of the voltages V_ref, V_mos1, V_mos2. It is already apparent from the profile of the voltage V_mos2 that there is a fault in the switching of the second MOSFET pair 36 starting from the sixth time slot Z6.

If the MOSFETs 34a, 34b of the first MOSFET pair 34 and the MOSFETs 36a, 36b of the second MOSFET pair 36 are each in a closed state, the values of the voltages V_mos1, V_mos2 are, as described, (significantly) above the value of the reference voltage V_ref. The comparator 70a thus receives a (significantly) higher value at its non-inverting input, as the voltage V_mos1, than at its inverting input, as the voltage V_ref. The comparator 70a therefore determines that the variable V_mos1 is at least equal to, actually greater than, the reference value V_ref and accordingly outputs a HIGH level (a 1) (see signal V_comp1). Furthermore, the comparator 70b receives a (significantly) higher voltage at its non-inverting input, as the voltage V_mos2, than at its inverting input, as the voltage V_ref. The comparator 70b therefore determines that the variable V_mos2 is at least equal to, actually greater than, the reference value V_ref and accordingly outputs a HIGH level (a 1) (see signal V_comp2).

If the MOSFETs 34a, 34b are in an open state and the MOSFETs 36a, 36b are in a closed state (see e.g. time period Tlow1 in time slots Z1, Z2, Z4, Z5, Z6, Z8, Z9), there is obtained as the voltage V_mos1 across the resistor 64b a voltage of at least virtually 0V and as the voltage V_mos2 across the resistor 66b a maximum value of at least V_ref. The first comparator 70a therefore determines that the value of its input variable V_mos1 is below the value of its other input variable V_ref (reference variable) and accordingly outputs a LOW level (digital 0) (see signal V_comp1). Furthermore, the second comparator 70b determines that the value of its input variable V_mos2 is not below the value of its other input variable V_ref (reference variable) (because the value V_mos2 is (significantly) greater than the value of the reference variable V_ref) and accordingly outputs a HIGH level (a 1) (see signal V_comp2).

If the MOSFETs 34a, 34b of the first MOSFET pair 34 are in a closed state and the MOSFETs 36a, 36b of the second MOSFET pair 36 are in an open state (see e.g. time period Tlow2 in the second time slot Z2, the third time slot Z3 and the fourth time slot Z4), there is obtained as the voltage V_mos2 across the resistor 66b a voltage of at least virtually 0V and as the voltage V_mos1 across the resistor 64b a maximum value (significantly) above the reference value V_ref. The first comparator 70a therefore determines that the value of its input variable V_mos1 is not below the value of its other input variable V_ref (reference variable) (because the value V_mos1 is (significantly) greater than the value of the reference variable V_ref) and accordingly outputs a HIGH level (digital 1) (see signal V_comp1). Furthermore, the second comparator 70b determines that the value of its input variable V_mos2 is below the value of its other input variable V_ref (reference variable) and accordingly outputs a LOW level (a 0) (see signal V_comp2).

Therefore, when the MOSFETs 34a, 34b of the first MOSFET pair 34 are open, a low level is obtained in the output signal V_comp1 of the first comparator 70a at approximately the time level of the LOW level of the first control signal V_phase1, that is to say approximately at the level of the time period Tlow1 in the first time slot Z1, in the second time slot Z2, in the fourth time slot Z4, in the fifth time slot Z5, in the sixth time slot Z6, in the eighth time slot Z8 and in the ninth time slot Z9.

The output signal V_comp1 of the first comparator 70a and the first control signal V_phase1 are then compared with one another in the first XOR gate 72a. In an ideal case without transit time delays and/or switching delays, the XOR gate 72a, owing to an ideal correspondence of the signals V_comp1 and V_phase1, would not determine any differences and would always output a LOW level (digital 0). In the real, non-ideal case, the first XOR gate 72a will output as the output variable V_out1 of the first XOR gate 72a double peaks which have occurred in each case as a result of transit time delays and/or switching delays. Because the MOSFETs 34a, 34b have switched reliably in each time period Tlow1, such double peaks occur in the region of each time period Tlow1.

If the MOSFETs 36a, 36b of the second MOSFET pair 36 are open, a low level is obtained in the output signal V_comp2 of the first comparator 70b at approximately the time level of the LOW level of the second control signal V_phase2. If, for example, it is assumed that at least one of the MOSFETs 36a, 36b, for example the MOSFET 36a, switches (opens) correctly in time slot Z2, Z3, Z4 but does not switch (open) correctly in time slots Z6, Z7, Z8, a low level is therefore obtained in the output signal V_comp2 of the first comparator 70b at approximately the time level of the LOW level of the second control signal V_phase2 in time slots Z2, Z3, Z4, while the level remains high in time slots Z6, Z7, Z8 because at least one of the MOSFETS 36a, 36b, for example the MOSFET 36a, does not open correctly.

The output signal V_comp2 of the second comparator 70b and the second control signal V_phase2 are then compared with one another in the second XOR gate 72b. In an ideal case without transit time delays and/or switching delays, the XOR gate 72b, owing to an ideal correspondence of the signals V_comp2 and V_phase2, would not determine any differences and would always output a LOW level (digital 0). In the real, non-ideal case, the second XOR gate 72b will output as the output variable V_out2 of the second XOR gate 72b double peaks which have occurred in each case as a result of transit time delays and/or switching delays. Because the MOSFETs 36a, 36b have switched reliably in the time period Tlow2 of time slots Z2, Z3, Z4, such double peaks occur in the region of the time period Tlow2 of time slots Z2, Z3, Z4.

If it is now assumed by way of example, as is shown in FIG. 4a, that in the sixth time slot Z6, seventh time slot Z7 and eighth time slot Z8 one of the MOSFETs 36a, 36b, for example the MOSFET 36a, does not open correctly even though the second control signal V_phase2 assumes a LOW level in the time period Tlow2, the MOSFET 36a remains in the closed state in the sixth time slot Z6, seventh time slot Z7 and eighth time slot Z8. As explained, a voltage that is (significantly) above the value of the reference voltage V_ref across the resistor 62b in this case drops across the resistor 66b as the voltage V_mos2. Both comparators 70a, 70b therefore determine, during Tlow2 in time slots Z6, Z7, Z8, that the voltage values V_mos1, V_mos2 at least correspond to, actually are significantly above, the reference voltage value V_ref. The first comparator 70a therefore determines that the value of its input variable V_mos1 is not below the value of its other input variable V_ref (reference variable) (because the value V_mos1 is (significantly) greater than the value of the reference variable V_ref) and accordingly outputs a HIGH level (digital 1) (see signal V_comp1). Furthermore, the second comparator 70b determines that the value of its input variable V_mos2 is not below the value of its other input variable V_ref (reference variable) (because the value V_mos2 is (significantly) greater than the value of the reference variable V_ref) and accordingly outputs a HIGH level (digital 1) (see signal V_comp2). In the sixth time slot Z6, seventh time slot Z7 and eighth time slot Z8, both comparators 70a, 70b therefore output a HIGH level for the signals V_comp1, V_comp2 also during the time period Tlow2. The XOR operation of the output of the second comparator 70b with the second control signal V_phase2 therefore leads to a (single) HIGH level approximately during the time period Tlow2 of the sixth time slot Z6, seventh time slot Z7 and eighth time slot Z8 (V_out2), not to a double peak.

The outputs of the first XOR gate 72a and of the second XOR gate 72b are inputted into an OR gate 74 as input variables. The output of the OR gate 74 is therefore an overlay of the outputs of the first XOR gate 72a and the second XOR gate 72b. The output signal V_out3 of the OR gate 74 therefore shows a double peak, which indicates the opening of the first and second MOSFET pairs 34, 36 during Tlow1 and Tlow2, in the first time slot Z1 to the fifth time slot Z5, and likewise shows a double peak, which indicates the opening of the first MOSFET pair 34 during Tlow1, in the sixth time slot Z6, eighth time slot Z8 and ninth time slot Z9.

The OR operation of the outputs of the two XOR gates 72a, 72b further leads in the sixth time slot Z6, seventh time slot Z7 and eighth time slot Z8 in each case to a (single) peak (at least approximately at the level of the time period Tlow2 in the sixth time slot Z6, seventh time slot Z7 and eighth time slot Z8). This one peak (instead of a double peak caused by transit time delays and/or switching delays with a smaller width of each peak) in the output signal of the OR gate 74 (V_out3) therefore indicates a fault in the opening of one of the MOSFETs 36a, 36b of the second MOSFET pair 36, for example the MOSFET 36a.

The identification of a fault can be improved by connecting a time delay, which in some cases is referred to in the following text as a time-delay element 76, downstream of the OR gate 74. The time delay has the result that only peaks with a duration above a predefined time threshold are identified as faults. The duration of the double peaks in the first time slot Z1 to the fifth time slot Z5 (and likewise in the sixth time slot Z6, eighth time slot Z8 and ninth time slot Z9) is in each case below the time threshold. Therefore, the output of the time-delay element 76 outputs a LOW level (see signal V_fehler). By contrast, the duration of the peaks in the sixth time slot Z6, seventh time slot Z7 and eighth time slot Z8 at the time period Tlow2 is above the time threshold. The time-delay element 76 therefore outputs a HIGH level (see signal V_fehler) for a specific time, which corresponds at least virtually to the time period Tlow2, in the sixth time slot Z6, seventh time slot Z7 and eighth time slot Z8.

According to a specific implementation of the time delay, the time-delay element 76 can be in the form of a switch-on delay or can effect a switch-on delay. In this case, the time-delay element 76 can effect time-delayed switching on or can switch on with a time delay, for example. The time delay can correspond at least to the magnitude (from the point of view of time) of one of the pulses of the double pulses of the signals Vout_1, Vout_2, Vout_3 or can be above that magnitude. As a result, the respective pulses of these double pulses are suppressed or faded out and only the longer pulses (i.e. the pulses with a width greater than the time delay or greater than the width of each peak of the double peak) are outputted, in each case shortened by the magnitude of the time delay in the fault signal V_fehler. This can be seen in FIG. 4b, in which a valid fault signal V_fehler is shown. In the signal V_fehler, the rising edge of a fault pulse is in each case offset or shortened (i.e. shortened at least by the width of a pulse of a double pulse/double peak) relative to the rising edge of a long peak by the magnitude of the switch-on delay, for example in the signal Vout_3. By contrast, the falling edge of the pulse of the fault signal V_fehler falls at the same time as the corresponding pulse in the signal Vout_3, because it is only a switch-on delay and not a switch-off delay. This concerns all time slots with faults, i.e. Z6, Z7 and Z8. By contrast, the pulses of each double pulse are suppressed by the switch-on delay. These are ultimately not actual/valid fault pulses.

As a result, the output signal V_fehler of the time-delay element 76 only shows a peak if there is a fault in the switching of one of the MOSFETs 34a, 34b, 36a, 36b. By contrast, transit time delays are suppressed. The output of the time delay 76 can therefore be referred to as a fault signal V_fehler. By means of an identification circuit, the peaks in the fault signal V_fehler can be identified automatically. On the basis of the peaks and the control signals, the identification circuit can immediately conclude in which of the two MOSFET pairs 34, 36 switching has not taken place correctly. A precise determination of whether, in the event of a fault in the MOSFET pair 36, the MOSFET 36a, the MOSFET 36b or both MOSFETs 36a, 36b did not switch correctly is not possible with the circuit shown but is not necessary for the intended applications. This is because, if at least one of the MOSFETs 34a, 34b or MOSFETS 36a, 36b does not switch, the MOSFET pair 34, 36 in question is replaced as a whole. Therefore, not only can the fault be identified promptly, but the component in question can be replaced or another response to eliminate the fault can be taken promptly.

FIGS. 3, 4a and 4b can be summarized as follows. In the circuit of FIG. 3a, a total of four MOSFETs 34a, 34b, 36a, 36b, for example in the form of power semiconductors, and more specifically in each case two MOSFET pairs 34, 36, are connected in parallel. The MOSFET pairs 34, 36 are each formed by two anti-serially connected MOSFETs 34a, 34b, 36a, 36b. The two power semiconductor pairs 34, 36 are alternately switched off and on by a logic. In order to be able to ensure that the connected loads 40 are supplied with power, at least one power semiconductor pair 34, 36 must always be switched on. Via in each case a voltage divider 64, 66 at the common source terminal of each power semiconductor pair 34, 36, the voltage at that point is measured (path voltage divider). The circuit additionally has a further voltage divider 62 on the side of the voltage source 10 (reference voltage divider). When both MOSFET pairs 34, 36 are on (closed), a (significantly) greater voltage is measured at the resistor 64b of the voltage divider 64 (path voltage divider) and at the resistor 66b of the voltage divider 66 (path voltage divider) than at the resistor 62b of the reference voltage divider 62. As soon as one of the MOSFET pairs 34, 36, more specifically at least one of the MOSFETs 34a, 34b, 36a, 36b of the MOSFET pairs 34, 36, switches off, the voltage at the voltage divider 64, 66 in question falls to a value of 0V (or at least significantly lower than the voltage at the reference voltage divider 62). By means of two comparators 70a, 70b, the output signal of the two path voltage dividers 64, 66 is compared with the voltage value at the reference voltage divider 62 and converted into digital signals by the comparators 70a, 70b. The signal shape at the outputs of the comparators 70a, 70b thus corresponds roughly to the signal sequence with which the respective MOSFET pairs 34, 36 are controlled. By comparing the control signal of the MOSFET pairs 34, 36 with the output signal of the respective comparator 70a, 70b by means of exclusive OR operation (XOR operation 72a, 72b), it is possible to detect whether the MOSFETS 34a, 34b, 36a, 36b of the MOSFET pairs 34, 36 actually switch off. The two signals combined by XOR of the two MOSFET pairs 34, 36 are then combined by an OR operation 74 into a signal and filtered by a switch-on delay 76. The switch-on delay 76 is advantageous for suppressing incorrect diagnoses triggered by signal transit times and/or switching delays. There is obtained as the fault signal V_fehler a pulse sequence which corresponds approximately (although shortened) to the control pulses of the defective MOSFET pair 34, 36. The output signal V_fehler of the switch-on delay 76 can then be read in and processed by a higher-level controller (not shown, but see controller 28 in FIG. 2). Alternatively, the pulse sequence can be converted into a static value by a storage element (not shown).

The above summary applies correspondingly to the variant of FIG. 3b, in which one of the semiconductor switches is in each case replaced by a semiconductor diode 34c, 36c. In the variant of FIG. 3b, a semiconductor pair does not switch if the single semiconductor switch does not switch. The semiconductor diode 34c, 36c allows the precise identification of the fault in the switching of the semiconductor switches.

Although the description of the exemplary embodiments of FIGS. 2 to 4b referred to identifying whether the first semiconductor switch pair 34 and/or the second semiconductor switch pair 36 is correctly transferred from a closed state into an open state, it can correspondingly be identified from the signal profiles whether the first semiconductor switch pair 34 and/or the second semiconductor switch pair 36 is correctly transferred from an open state into a closed state.

The identification of a non-switching semiconductor switch of the first semiconductor switch pair 34 and/or second semiconductor switch pair 36 permits the use of simple and inexpensive components and it is possible to dispense with a series connection of a further semiconductor switch in each case for redundancy purposes. Furthermore, owing to the formation of pairs, the circuit is able to switch bidirectionally, that is to say loads can be switched off on the input side and on the output side. The circuit further operates without multiple current measurements and therefore with low losses and efficiently. In order to achieve the required safety aims, the circuit additionally manages without multiple MOSFETs connected in series.

Although reference is always made in the description of the exemplary embodiments of FIGS. 2 to 4b only to a first semiconductor switch pair 34 and a second semiconductor switch pair 36, these exemplary embodiments and the invention in general are not limited to exactly two semiconductor switch pairs 34, 36 connected in parallel. Three or more than three semiconductor switch pairs can likewise be provided. In summary, therefore, there can be at least two semiconductor switch pairs 34, 36, and at least one non-switching semiconductor switch pair can be identified from these at least two semiconductor switch pairs 34, 36 connected in parallel.

An advantage of connecting at least a third semiconductor switch pair in parallel with the first semiconductor switch pair 34 and the second semiconductor switch pair 36 will now be described with reference to FIGS. 3a to 4b, without the at least a third semiconductor switch pair being shown in the figures.

As described, in the first time slot Z1 the first semiconductor switch pair 34 is opened when the first control signal V_phase1 assumes a LOW level in the time period Tlow1. After the time period Tlow1 has passed, the first control signal V_phase1 assumes a HIGH level again. The first semiconductor switch pair 34 would in this case close again. However, if at least one of the semiconductors 34a, 34b of the first semiconductor switch pair 34 is defective, the at least one of the semiconductors 34a, 34b of the first semiconductor switch pair 34 remains open, that is to say it no longer closes even though the first control signal V_phase1 has assumed a HIGH level again. As described, the second semiconductor switch pair 36 will open in the second time slot Z2 during the time period Tlow2 because the second control signal assumes a LOW level during the time period Tlow2. Consequently, during the time period Tlow2, both the first semiconductor switch pair 34 is open (because at least one of the semiconductors 34a, 34b no longer closes even though it should actually be closed) and the second semiconductor switch pair 36 is open (owing to the LOW level of the second control signal V_phase2). Thus, the load is (briefly) disconnected completely from the supply during the time period Tlow2 in time slot Z2.

By contrast, if at least a third semiconductor switch pair is connected in parallel, this third semiconductor switch pair—if switched correctly—can permit a kind of emergency operation. This is because the at least a third semiconductor switch pair will be in a closed state during the time period Tlow2 with the aid of at least a third control signal, which assumes a HIGH level during the time period Tlow2. As a result, the load is not disconnected from the system and the current supply and is consequently not switched off.

The invention claimed is:

1. A system for identifying a non-switching semiconductor switch, wherein the system has:
    a first semiconductor switch which is controllable by means of a first control signal, and a first semiconductor device which is configured and arranged to prevent a current flow through the first semiconductor device at least in one direction;
    a second semiconductor switch which is controllable by means of a second control signal and is connected in parallel with the first semiconductor switch, and a second semiconductor device which is configured and arranged to prevent a current flow through the second semiconductor device at least in one direction;
    a first resistor, wherein one end of the first resistor is connected between the first semiconductor switch and the first semiconductor device and another end of the first resistor is connected to a reference potential;
    a second resistor, wherein one end of the second resistor is connected between the second semiconductor switch and the second semiconductor device and another end of the second resistor is connected to the reference potential; and
    a determination unit which is configured to identify, on the basis of a profile of a first voltage drop across the first resistor, whether the first semiconductor switch does not switch, and which is configured to identify, on the basis of a profile of a second voltage drop across the second resistor, whether the second semiconductor switch does not switch, wherein the determination unit has:
    a first comparison component, which is configured to determine a first comparison profile by comparing the profile of the first voltage with a profile of a reference voltage that drops across a reference resistor; and
    a second comparison component, which is configured to determine a second comparison profile by comparing the profile of the second voltage with the profile of the reference voltage that drops across the reference resistor, wherein the determination unit has:
    a first logic component, wherein the first logic component is configured to determine a first logic signal by combining the first comparison profile with the first control signal; and/or
    a second logic component, wherein the second logic component is configured to determine a second logic signal by combining the second comparison profile with the second control signal.

2. The system as claimed in claim 1, wherein
    the first semiconductor device is in the form of a first semiconductor diode and the first semiconductor diode is arranged to form a path with the first resistor when the first semiconductor switch is in an open state, and the first semiconductor diode is configured to prevent a current flow through the path that has been formed when the first semiconductor switch is in the open state; and/or
    the second semiconductor device is in the form of a second semiconductor diode and the second semiconductor diode is arranged to form a path with the second resistor when the second semiconductor switch is in an open state, and the semiconductor diode is configured to prevent a current flow through the path that has been formed when the second semiconductor switch is in the open state.

3. The system as claimed in claim 1, wherein
    the first semiconductor device is in the form of a semiconductor switch which is connected anti-serially to the first semiconductor switch; and/or
    the second semiconductor device is in the form of a semiconductor switch which is connected anti-serially to the second semiconductor switch.

4. The system as claimed in claim 1, wherein the system has:
    a first voltage divider circuit which has the first resistor and at least one further resistor, wherein one end of the first voltage divider circuit is connected between the first semiconductor switch and the first semiconductor device and another end of the first voltage divider circuit is connected to the reference potential; and/or
    a second voltage divider circuit which has the second resistor and at least one further resistor, wherein one end of the second voltage divider circuit is connected between the second semiconductor switch and the second semiconductor device and another end of the second voltage divider circuit is connected to the reference potential.

5. The system as claimed in claim 1, wherein the system has a reference voltage divider which has the reference resistor and at least one further resistor.

6. The system as claimed in claim 1, wherein the determination unit has a third logic component, wherein the third logic component is configured to determine an output signal by combining the first logic signal with the second logic signal.

7. The system as claimed in claim 1, wherein the system further has a delay element which is configured to determine a fault signal by applying a switch-on delay.

8. A method for identifying a non-switching semiconductor switch, wherein the method comprises:
    controlling a first semiconductor switch by means of a first control signal;
    controlling a second semiconductor switch connected in parallel with the first semiconductor switch by means of a second control signal;
    identifying, on the basis of a profile of a first voltage drop across a first resistor, whether the first semiconductor switch does not switch, wherein one end of the first resistor is connected between the first semiconductor switch and a first semiconductor device and another end of the first resistor is connected to a reference potential, wherein the first semiconductor device is configured and arranged to prevent a current flow through the first semiconductor device at least in one direction;

identifying, on the basis of a profile of a second voltage drop across a second resistor, whether the second semiconductor switch does not switch, wherein one end of the second resistor is connected between the second semiconductor switch and a second semiconductor device and another end of the second resistor is connected to the reference potential, wherein the second semiconductor device is configured and arranged to prevent a current flow through the second semiconductor device at least in one direction;

determining a first comparison profile by comparing the profile of the first voltage with a profile of a reference voltage that drops across a reference resistor;

determining a second comparison profile by comparing the profile of the second voltage with the profile of the reference voltage that drops across the reference resistor;

determining a first logic signal by combining the first comparison profile with the first control signal; and/or determining a second logic signal by combining the second comparison profile with the second control signal.

* * * * *